United States Patent
Kirby

(10) Patent No.: US 12,308,348 B2
(45) Date of Patent: *May 20, 2025

(54) MULTI-HEIGHT INTERCONNECT STRUCTURES AND ASSOCIATED SYSTEMS AND METHODS

(71) Applicant: Micron Technology, Inc., Boise, ID (US)

(72) Inventor: Kyle K. Kirby, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/103,315

(22) Filed: Jan. 30, 2023

(65) Prior Publication Data
US 2023/0170331 A1    Jun. 1, 2023

Related U.S. Application Data

(62) Division of application No. 16/781,707, filed on Feb. 4, 2020, now Pat. No. 11,569,203.

(51) Int. Cl.
*H01L 25/065* (2023.01)
*H01L 21/768* (2006.01)

(52) U.S. Cl.
CPC .... *H01L 25/0657* (2013.01); *H01L 21/76897* (2013.01); *H01L 2225/06548* (2013.01);
(Continued)

(58) Field of Classification Search
CPC .......... H01L 25/0657; H01L 21/76897; H01L 2225/06548; H01L 2225/1058; H01L 2924/10253; H10B 80/00
See application file for complete search history.

(56) References Cited

U.S. PATENT DOCUMENTS 9,040,348 B2 * 5/2015 Vodrahalli .......... H01L 25/0657
438/109
9,099,364 B1 * 8/2015 Hsu .................. H01L 24/11
(Continued)

OTHER PUBLICATIONS

International Application No. PCT/US2021/013117—International Search Report and Written Opinion, dated Apr. 30, 2021, 21 pages.
(Continued)

*Primary Examiner* — Timor Karimy
(74) *Attorney, Agent, or Firm* — Perkins Coie LLP

(57) ABSTRACT

Systems and methods for multi-height interconnect structures for a semiconductor device are provided herein. The multi-height interconnect structure generally includes a primary level semiconductor die having a primary conductive pillar and a secondary conductive pillar, where the primary conductive pillar has a greater height than the secondary conductive pillar. The semiconductor device may further include a substrate electrically coupled to the primary level semiconductor die through the primary conductive pillar and a secondary level semiconductor die electrically coupled to the primary level semiconductor die through the secondary conductive pillar. The multi-height pillars may be formed using a single photoresist mask or multiple photoresist masks. In some configurations, the primary and secondary conductive pillars may be arranged on only the front-side of the dies and/or substrate.

9 Claims, 6 Drawing Sheets

(52) U.S. Cl.
CPC ............. *H01L 2225/1058* (2013.01); *H01L 2924/10253* (2013.01)

(56) References Cited

U.S. PATENT DOCUMENTS

| | | |
|---|---|---|
| 9,761,568 B2 | 9/2017 | Fang et al. |
| 2011/0291261 A1 | 12/2011 | Fleischman et al. |
| 2013/0075903 A1 | 3/2013 | Pagaila et al. |
| 2015/0123268 A1 | 5/2015 | Yu et al. |
| 2016/0064309 A1 | 3/2016 | Su et al. |
| 2018/0005987 A1* | 1/2018 | Hiner ............... H01L 24/16 |
| 2020/0006293 A1 | 1/2020 | Sankman et al. |
| 2021/0242174 A1 | 8/2021 | Kirby |

OTHER PUBLICATIONS

TW Patent Application No. 110102997—Taiwanese Office Action and Search Report, dated Oct. 18, 2021, with English Translation, 15 pages.

TW Patent Application No. 111118947—Taiwanese Office Action and Search Report, dated Jul. 12, 2024, with English Translation, 9 pages.

KR Patent Application No. 10-2022-7029808—Korean Office Action and Search Report, dated Sep. 9, 2024, with English Translation, 13 pages.

\* cited by examiner

MULTI-HEIGHT INTERCONNECT STRUCTURES AND ASSOCIATED SYSTEMS AND METHODS

CROSS-REFERENCE TO RELATED APPLICATION(S)

This application is a division of U.S. patent application Ser. No. 16/781,707, filed Feb. 4, 2020, which is incorporated herein by reference in its entirety.

TECHNICAL FIELD

The present disclosure is generally directed to semiconductor devices, and in several embodiments, more particularly to systems and methods of forming multi-height interconnect structures for die-to-die, die-to-substrate, and/or three-dimensional integration interconnects.

BACKGROUND

Microelectronic devices, such as memory devices, microprocessors, and light emitting diodes, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies while increasing the capacity and/or speed of the resulting encapsulated assemblies. To meet these and other demands, semiconductor die manufacturers often stack multiple semiconductor dies vertically on top of each other to increase the capacity or performance of a microelectronic device within the limited volume on the circuit board or other element to which the semiconductor dies are mounted. In vertical semiconductor die stack assemblies, through-silicon vias (TSV) are often used to make an electrical connection through a die.

Individual or stacked semiconductor dies are typically electrically coupled at the die-to-multiple-die (D2MD) or die-to-substrate (D2S) configurations with different sized solder balls through metal bond pads on the dies or traces on the substrate. Some die-to-die (D2D) interconnects are made with pillars formed on the bond pads. During assembly, the solder balls and/or solder bumps on the end of the pillars are reflowed to form the connection from D2D, D2MD, and D2S electrical connections. Conventional assembly methods using different sized solder balls limit the possible die configurations.

DETAILED DESCRIPTION

Figure 1A:
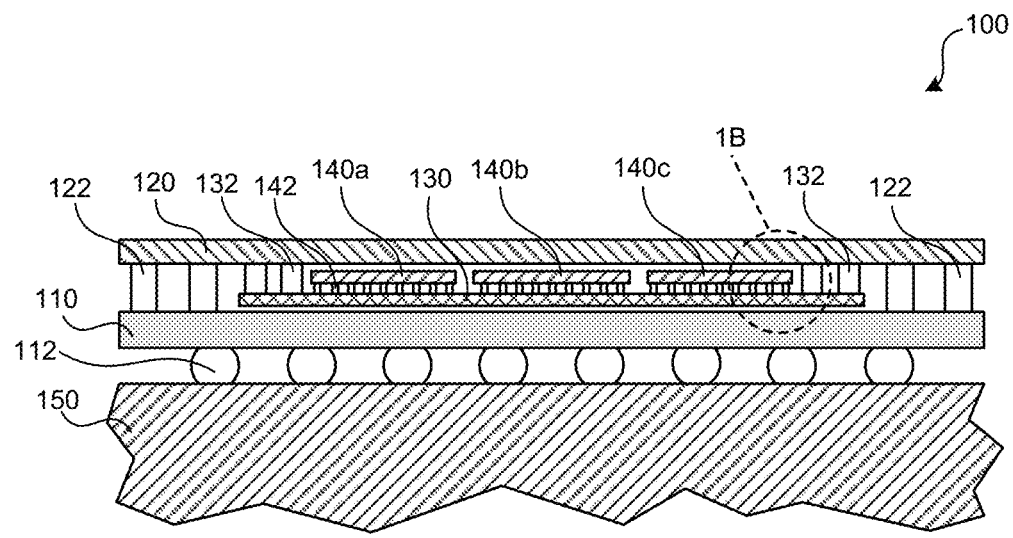
FIG. 1A is an enlarged cross-sectional view showing a semiconductor device having multi-height interconnect structures configured in accordance with an embodiment of the present technology.

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device.

Depending upon the context in which it is used, the term "substrate" can refer to a structure that supports electronic components (e.g., a die), such as a wafer-level substrate, a singulated die-level substrate, or another die for die-stacking applications. A person having ordinary skill in the relevant art will recognize that suitable steps of the methods described herein can be performed at the wafer-level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques.

The present technology includes multi-height interconnect structures defined by pillars of different lengths (e.g., heights) on a single die to enable simultaneous D2D, D2MD, and/or D2S connections. In contrast to the present technology, conventional semiconductor device packages with different sized solder balls limit the configurations of semiconductor packages when size and spacing do not allow clearance between interconnects for the diameter of the solder ball, especially as the spacing between the semiconductor components grows, requiring larger diameter solder balls and a corresponding larger space between bond pads. In other conventional configurations, the use of solder balls can limit the manufacturing process options, and may require TSV and backside processing. As the size and spacing of the dies becomes smaller and tighter, multi-height pillars allow closer bond pad spacing while interconnecting semiconductor components.

Multi-height pillars may be used in thin die (typically having a wafer thickness below 150 micrometers), ultra thin die (typically having a wafer thickness below 50 micrometers), and ultra thin bond line (typically having a bond thickness below 15 micrometers) multichip package (MCP) applications, among other applications. The die thickness and spacing in such MCP applications results in short separation distances such that pillars may be used to form certain D2D, D2MD, and D2S electrical connections. In some embodiments, the substrate or lowest die which connects to the PCB or other component can still use solder ball connections; however, solder balls can be too wide to use in certain configurations. The illustrated pillar configurations of FIGS. 1A-3 are exemplary and the pillars shown and described may have different heights to create the desired spacing configurations between the dies and substrate, or may have different widths and/or quantities.

Figure 1B:
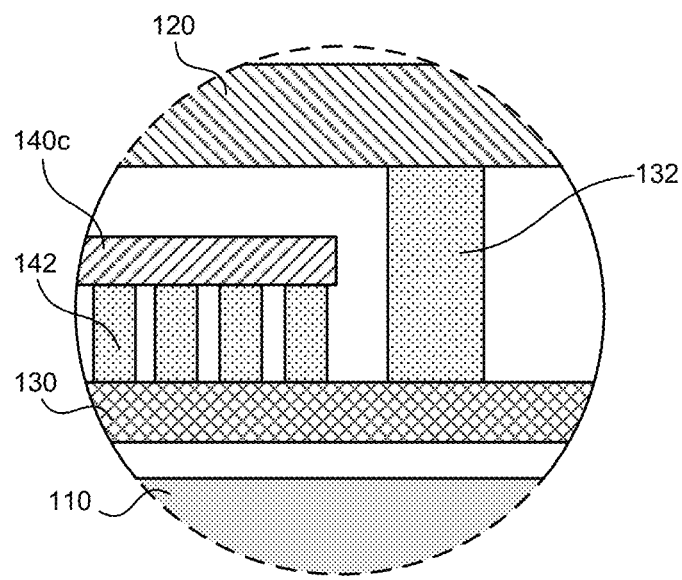
FIG. 1B is a detail view showing an enlarged portion of the semiconductor device of FIG. 1A.

FIGS. 1A and 1B show a semiconductor device assembly 100 ("device 100") having multi-height pillars electrically connecting D2D, D2MD, and D2S configurations. The device 100 includes a substrate 110 electrically coupled to a component, such as a printed circuit board (PCB) 150, using solder balls 112. The device 100 includes multiple semiconductor dies electrically coupled to the substrate 110 either directly or indirectly. In the illustrated embodiment, the device 100 has a primary level die 120, a secondary level die 130, and tertiary level dies 140 (identified individually by reference numbers 140a, 140b and 140c). The device 100 has primary pillars 122 electrically coupling the primary level die 120 to the substrate 110, and secondary pillars 132 electrically coupling the secondary level die 130 to the primary level die 120. As shown, the first and second pillars 122 and 132 have different heights such that the primary level die 120 can form the electrical connections to both the substrate 110 (D2S) and the secondary level die 130 (D2D), which both have different spacing configurations from the primary level die 120.

The device 100 may also include tertiary pillars 142 to electrically connect the tertiary level dies 140a-c to the secondary level die 130 (D2D). The tertiary pillars 142 may have a constant height for forming the connection between the secondary level die 130 and the tertiary level dies 140a-c, such that the tertiary level dies 140a-c are all spaced apart from the secondary level die 130 by the same distance.

The secondary pillars 132 may be formed on either the primary level die 120 or the secondary level die 130 depending on the manufacturing process and/or design preference. In embodiments where the secondary pillars 132 are formed on the secondary level die 130, the secondary pillars 132 and the tertiary pillars 142 form electrical connections in a D2MD configuration in which the secondary level die 130 is electrically coupled to both the primary level die 120 and the tertiary level dies 140a-c. The primary, secondary, and tertiary pillars 122, 132, and 142, respectively, have suitable lengths and widths to form the electrical connections and provide the desired spacing between the components of the device 100. In FIG. 1A, the primary pillars 122 can be formed on the front-side of the substrate 110, the secondary pillars 132 can be formed on the front-side of the primary level die 120, and the tertiary pillars 142 can be formed on the front-sides of the third dies 140a-c. In this arrangement, the solder balls 112 electrically couple the first substrate 110 to the PCB 150 through the backside of the substrate 110.

Figure 2:
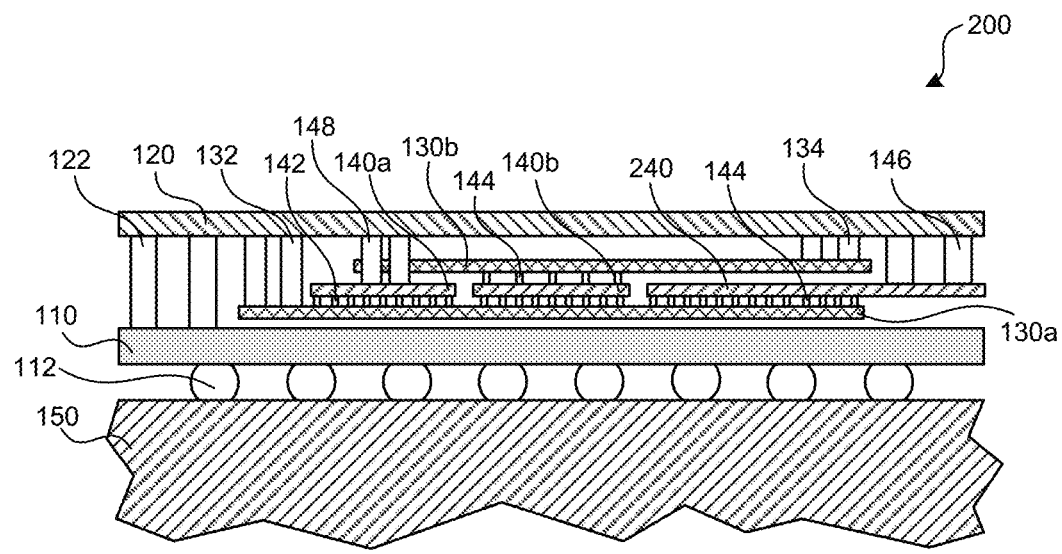
FIG. 2 is an enlarged cross-sectional view showing a semiconductor device having multi-height interconnect structures configured in accordance with another embodiment of the present technology.

FIG. 2 shows a semiconductor device assembly 200 ("device 200") having multi-height pillars electrically connecting D2D, D2MD, and D2S configurations in a different arrangement than device 100. In the device 200, the substrate 110 is electrically coupled to the PCB 150 using the solder balls 112. The device 200 also includes multiple semiconductor dies electrically coupled to the substrate 110 either directly or indirectly. The device 200 differs from the device 100 shown in FIG. 1A in that the device 200 has first and second secondary level dies 130a, 130b and two different types of tertiary level dies 140a-b and 240. For example, the tertiary level dies 140a-b can define a first type of tertiary die and the tertiary level die 240 can define a second type of tertiary die. Like reference numbers refer to similar features in FIGS. 1A-2, but the features may be different and have different sizes.

The device 200 also includes the primary pillars 122 for electrically coupling the primary level die 120 to the substrate 110 as described above with respect to the device 100, but the primary pillars 122 of the device 200 are longer than those of the device 100. The primary level die 120 is also electrically coupled to (a) a first secondary level die 130a by first secondary pillars 132, and (b) a second secondary level die 130b by second secondary pillars 134 that are shorter than the first secondary pillars 132.

The tertiary level dies 140a-b are electrically coupled to the first secondary level die 130a by first tertiary pillars 142, which can be formed using front-side processing techniques. The tertiary level die 140a is also coupled directly to the primary level die 120 by TSVs 148 that pass through the second secondary level die 130b. The tertiary level die 140b is coupled to the second secondary level die 130b by second tertiary pillars 144. As such, the second secondary level die 130b of the device 200 may include front-side and backside processing for a D2MD connection.

In the illustrated configuration of the device 200, the primary level die 120 is further electrically coupled to the tertiary level die 240 by multi-level pillars 146. In this regard, the primary level die 120 forms D2S electrical connections through the primary pillars 122; D2MD electrical connections through the first secondary pillars, second secondary pillars, and multi-level pillars 132, 134, and 146, respectively; and D2D electrical connections through the TSVs 148.

Figure 3:
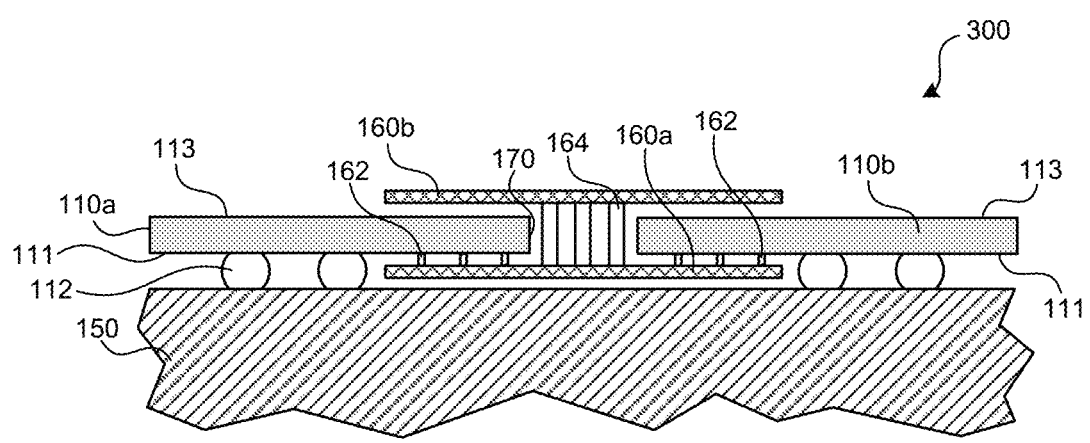
FIG. 3 is an enlarged cross-sectional view showing a multiple chip-on-board (COB) semiconductor device having multi-height interconnect structures configured in accordance with another embodiment of the present technology.

FIG. 3 shows a semiconductor device assembly 300 ("device 300") having multi-height pillars electrically connecting a multiple Chip-on-Board (COB) configuration with all front-side processing. The device 300 includes a substrate having a first substrate portion 110a and a second substrate portion 110b electrically coupled to the PCB 150 using the solder balls 112. The substrate can also have an aperture 170 between the first and second substrate portions 110a-b through which interconnects can pass. Although FIG. 3 shows a single substrate or PCB with the aperture 170, other embodiments can have separate first and second substrates with a gap therebetween for equivalent functionality. The first and second substrate portions 110a-b have a front-side 111 and a backside 113. The device 300 further includes a first COB 160a and a second COB 160b. The first COB 160a is electrically coupled to both of the first and second substrates 100a-b by primary pillars 162, and the second COB 160b is electrically coupled to the first COB 160a by secondary pillars 164. In this embodiment, the secondary pillars 164 are electrically coupled to a front-side of the first COB 160a and a front-side of the second COB 160b. The arrangement of the device 300 allows a multiple COB configuration without TSVs or backside processing.

The present technology includes several advantages over conventional die stacking techniques that use different sized solder balls. In some embodiments, the multi-height pillar configurations of the present technology enable stacking of two or more different types of dies with only front-side processing. Conventional technology requires TSV and/or backside processing for such a configuration. Additionally, the present technology provides (a) shorter package and stack heights, (b) tighter pitch, (c) faster manufacturing, and (d) a greater number of configurations and applications. The illustrated embodiments depict several examples of semiconductor devices using the multi-height pillar configurations of the present technology; however, further device configurations having multi-height pillars are within the scope of the present technology.

The multi-height pillars may be formed from suitable conductive materials, such as copper (Cu), and have solder caps to form the electrical connections (e.g., tin-silver (SnAg) solder caps). During assembly, the solder cap is reflowed using gang reflow, sonic reflow, or other techniques. The multi-height pillars can be formed on a single die. Depending on the difference in pillar height, multi-height pillars with a large difference in height may be formed using multiple mask processing techniques. However, if the difference in height of the multi-height pillars is minor, a single mask with varied diameter resist openings may be used. The bond pads where the pillars are formed are typically copper pads such that copper pillars are coupled to the bond pad using copper-to-copper bonding. In other embodiments, the multi-height pillars can be formed from a different material than the bond pad, or can be formed from a combination of materials. Methods for forming the multi-height pillars using a single photoresist mask with varied diameter resist opening and/or multiple photoresist mask processing techniques will be described in reference to FIGS. 4A-5C.

Figure 4A:
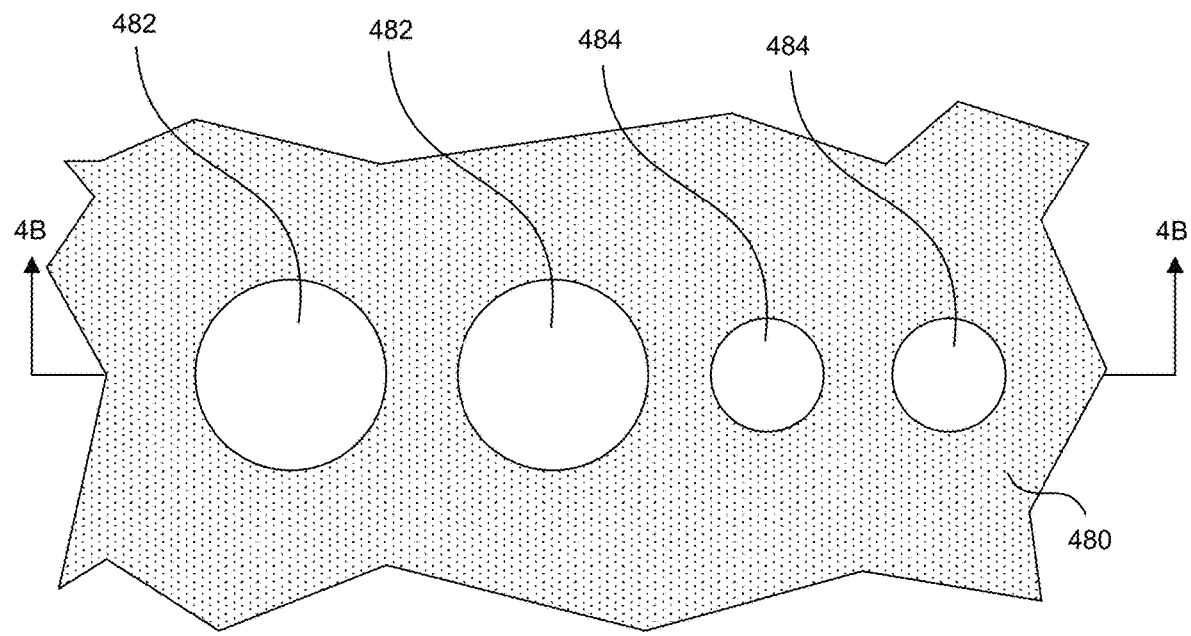
FIG. 4A is an enlarged plan view showing a photoresist mask having primary and secondary resist openings with different diameters configured in accordance with another embodiment of the present technology.
Figure 4B:
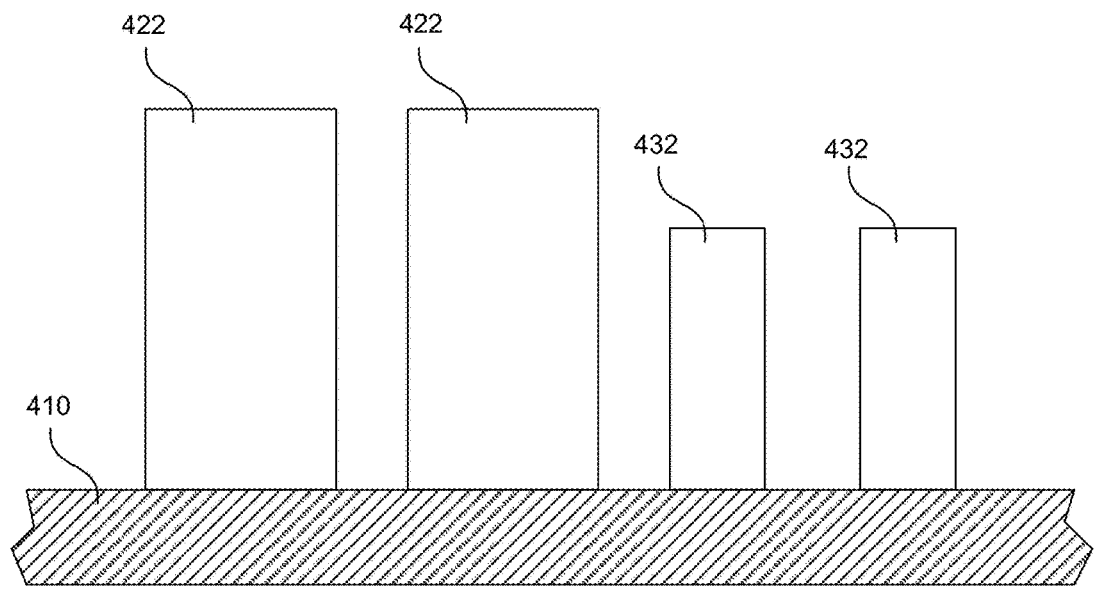
FIG. 4B is a cross-sectional view of a semiconductor device having multi-height interconnect structures formed using the photoresist mask of FIG. 4A.

FIGS. 4A and 4B show an enlarged plan and cross-section view of one configuration of forming multi-height pillars using a single photoresist mask. A photoresist mask 480 may include primary resist openings 482, and secondary resist openings 484 having a smaller diameter than the primary resist openings 482. The photoresist mask 480 masks portions of the die surface other than the portions where pillars are to be formed. After the photoresist mask 480 is applied to the die, metal is electrochemically plated onto the primary and secondary resist openings 482 and 484 to form primary pillars 422 and secondary pillars 432, respectively. The different diameters between the primary and secondary resist openings 482 and 484 causes a differential rate of metal to be deposited through the primary and secondary resist openings 482 and 484. This results in different heights between the primary and secondary pillars 422 and 432. The photoresist mask 480 is then removed from the die to expose the primary and secondary pillars 422 and 432, as shown in FIG. 4B. The primary pillars 422 extend from a substrate 410 to a greater height than the secondary pillars 432, which may be used to form the primary and secondary pillars 122 and 132 shown in FIG. 1A, among other possible multi-height pillar configurations.

Figure 5A:
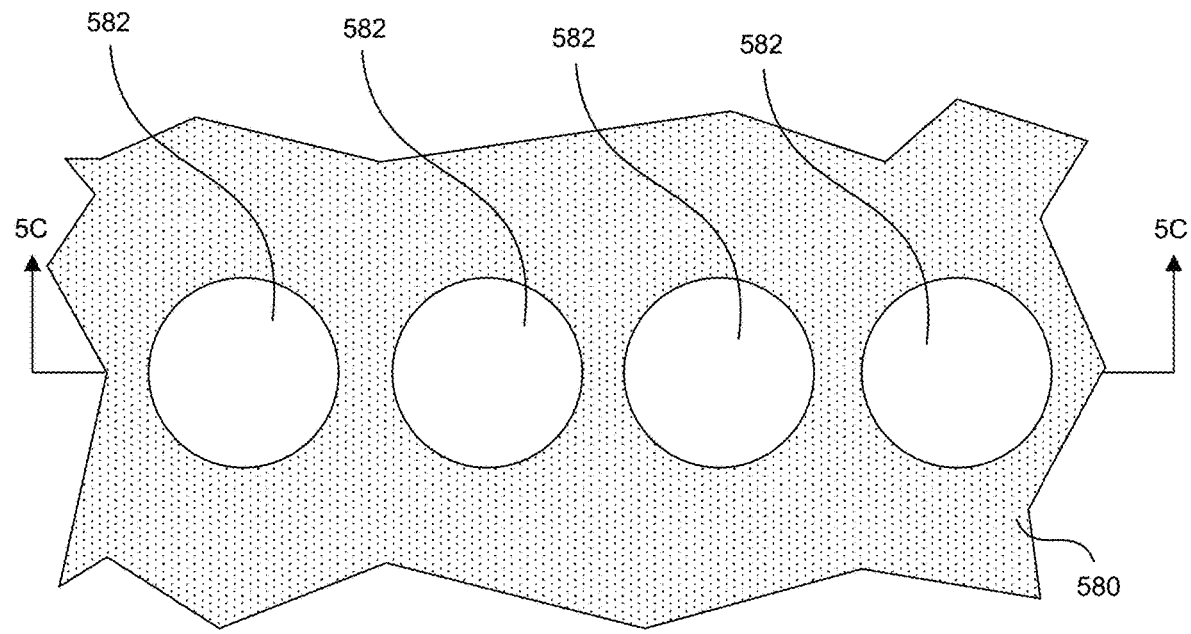
FIGS. 5A and 5B are enlarged plan views showing first and second photoresist masks having first and second resist openings configured in accordance with another embodiment of the present technology.
Figure 5B:
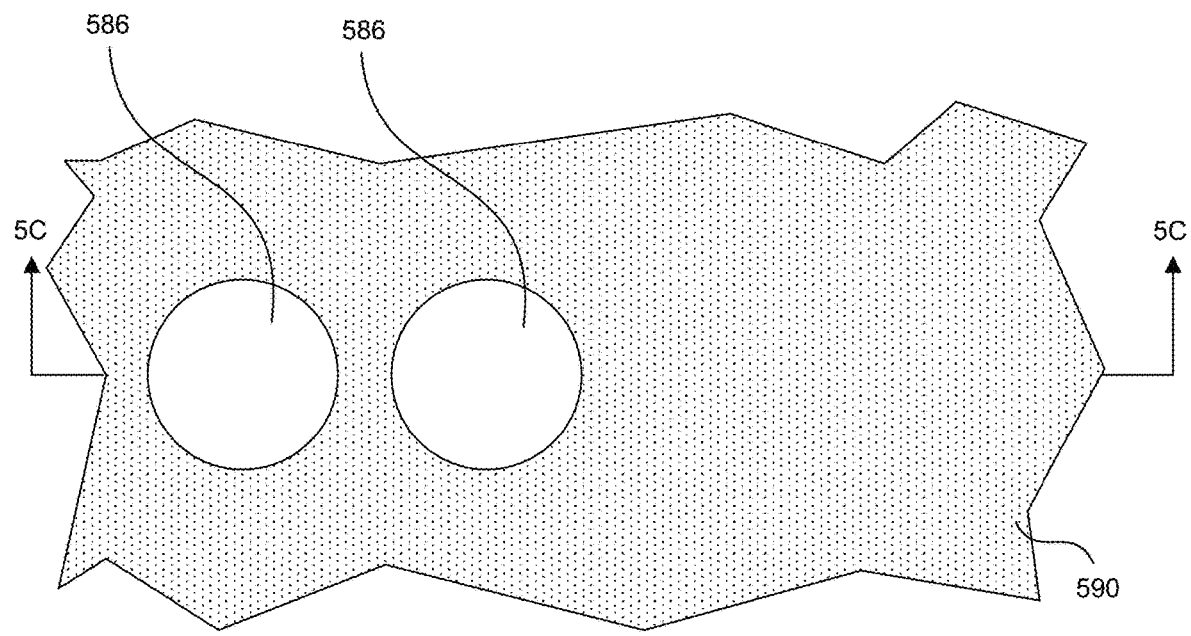
Figure 5C:
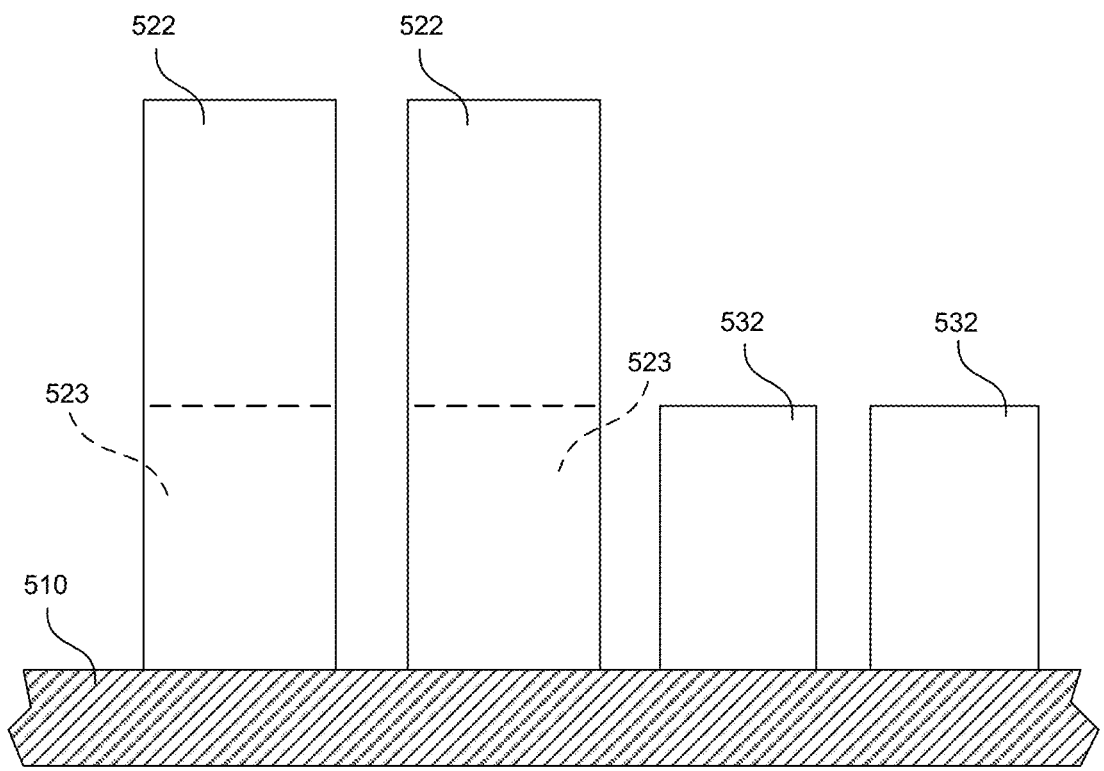
FIG. 5C is a cross-sectional view of a semiconductor device having multi-height interconnect structures formed using the photoresist masks of FIGS. 5A and 5B.

FIGS. 5A-5C show enlarged plan views and a cross-section view of one configuration of forming multi-height pillars using multiple photoresist masks. As shown in FIG. 5A, a first photoresist mask 580 may include first resist openings 582 generally having equal diameters. After the first photoresist mask 580 is applied to the die, metal is electrochemically plated onto the first resist openings 582 to form partial primary pillars 523 and secondary pillars 532, respectively. In this regard, the first resist openings 582 may be configured to form the partial primary pillars 523 to an intermediate height shown in broken lines (see FIG. 5C). After the metal is plated using the first photoresist mask 580, the partial primary pillars 523 and the secondary pillars 532 have a substantially equal height, where the intermediate height of the partial primary pillars 523 is substantially the same height as the secondary pillars 532. The first photoresist mask 580 is then removed from the die to expose the partial primary pillars 523 at the intermediate height and the secondary pillars 522 at full height.

Next, as shown in FIG. 5B, a second photoresist mask 590 may include second resist openings 586 aligned with the partial primary pillars 523 formed using the first photoresist mask 580. As shown, there may be no resist openings aligned with the secondary pillars 532 so that no further metal is deposited on the secondary pillars 532. The diameter of the second resist openings 586 may be similar to or different from the diameter of the first resist openings 582. After the second photoresist mask 590 is applied to the die, metal is electrochemically plated into the second resist openings 586 to continue to form primary pillars 522, extending the partial primary pillars 523 to a greater height than the secondary pillars 532, as shown in FIG. 5C. The primary pillars 522 extend from a substrate 510 to a greater height than the secondary pillars 532 and generally can have a greater height differential than the primary and secondary pillars 422 and 432 made with a single photoresist mask. The greater height differential possible with multiple photoresist masks may be used to form, in one example, the primary and secondary pillars 162 and 164 shown in FIG. 3, among other possible multi-height pillar configurations.

Figure 6:
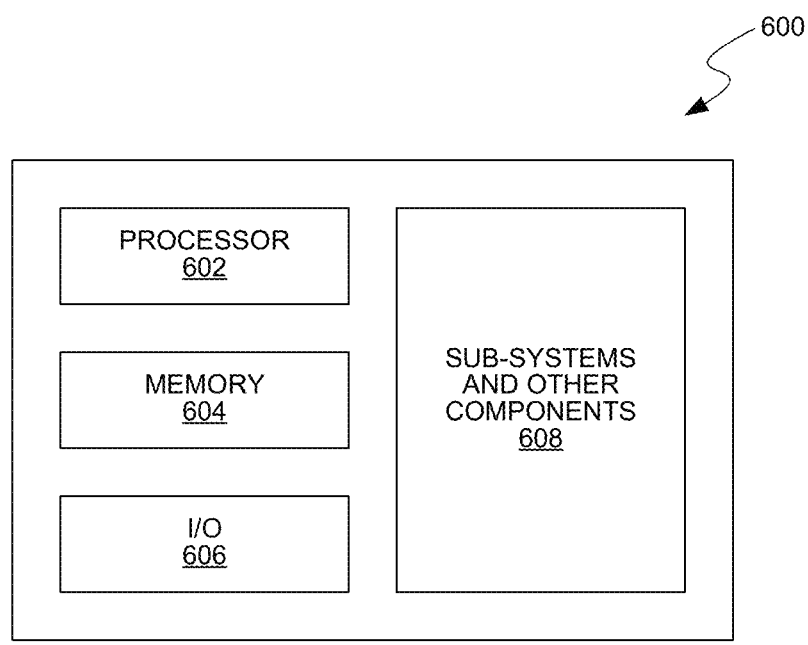
FIG. 6 is a schematic view of a system that includes a semiconductor device configured in accordance with embodiments of the present technology.

FIG. 6 is a block diagram illustrating a system that incorporates a semiconductor device in accordance with embodiments of the present technology. Any one of the semiconductor devices having the features described above with reference to FIGS. 1A-5C can be incorporated into any of a myriad of larger and/or more complex systems, a representative example of which is system 600 shown schematically in FIG. 6. The system 600 can include a processor 602, a memory 604 (e.g., SRAM, DRAM, flash, and/or other memory devices), input/output devices 606, and/or other subsystems or components 608. The semiconductor assemblies, devices, and device packages described above with reference to FIGS. 1A-5C can be included in any of the elements shown in FIG. 6. The resulting system 600 can be configured to perform any of a wide variety of suitable computing, processing, storage, sensing, imaging, and/or other functions. Accordingly, representative examples of the system 600 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 600 include lights, cameras, vehicles, etc. In these and other examples, the system 600 can be housed in a single unit or distributed over multiple interconnected units, e.g., through a communication network. The components of the system 600 can accordingly include local and/or remote memory storage devices and any of a wide variety of suitable computer-readable media.

As used in the foregoing description, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, left/right, and distal/proximate can be interchanged depending on the orientation. Moreover, for ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

The foregoing disclosure may also reference quantities and numbers. Unless specifically stated, such quantities and numbers are not to be considered restrictive, but exemplary of the possible quantities or numbers associated with the new technology. Also, in this regard, the present disclosure may use the term "plurality" to reference a quantity or number. In this regard, the term "plurality" is meant to be any number that is more than one, for example, two, three, four, five, etc. For the purposes of the present disclosure, the phrase "at least one of A, B, and C," for example, means (A), (B), (C), (A and B), (A and C), (B and C), or (A, B, and C), including all further possible permutations when greater than three elements are listed.

From the foregoing, it will be appreciated that specific embodiments of the new technology have been described herein for purposes of illustration, but that various modifications may be made without deviating from the present disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the present disclosure. Accordingly, the present disclosure and associated technology can encompass other embodiments not expressly shown or described herein.

I claim:

1. A method for forming multi-height conductive pillars on a semiconductor die, the method comprising:
   applying a first photoresist mask to a surface of the semiconductor die, the first photoresist mask having a first resist opening configured to partially form a primary conductive pillar and a second resist opening configured to form a secondary conductive pillar;
   electrochemically plating metal by an electrochemical plating process onto the semiconductor die through the first resist opening to partially form the primary conductive pillar to a first height and through the second resist opening to form the secondary conductive pillar to the first height;
   removing the first photoresist mask from the semiconductor die to expose the partially formed primary conductive pillar and the secondary conductive pillar;
   applying a second photoresist mask, after removing the first photoresist mask, to the surface of the semiconductor die covering the secondary conductive pillar, the second photoresist mask having a third resist opening aligned with the partially formed primary conductive pillar and configured to partially form the primary conductive pillar;
   electrochemically plating metal by an electrochemical plating process onto the semiconductor die through the third resist opening to partially form the primary conductive pillar to a second height greater than the first height; and
   removing the second photoresist mask from the semiconductor die to expose the primary conductive pillar extending to the second height and the secondary conductive pillar extending to the first height.

2. The method of claim 1, wherein the first resist opening and the second resist opening have equal diameters.

3. The method of claim 2, wherein:
   the first photoresist mask further comprises a fourth resist opening configured to form a tertiary conductive pillar; and
   the method further comprises electrochemically plating metal by an electrochemical plating process onto the semiconductor die through the fourth resist opening to form the tertiary conductive pillar to a third height less than the first and second heights.

4. The method of claim 3, wherein the fourth resist opening has a smaller diameter than the first and second resist openings.

5. A method of making a semiconductor assembly with multi-height conductive pillars, comprising:
   applying a first photoresist mask to a surface of a first semiconductor die, the first photoresist mask having a first resist opening configured to form a primary conductive pillar and a second resist opening configured to form a secondary conductive pillar;
   electrochemically plating metal by a single electrochemical plating process onto the first semiconductor die through the first resist opening to form the primary conductive pillar from the surface to a first height and simultaneously through the second resist opening to form the secondary conductive pillar from the surface to a second height different than the first height such that a first top surface of the primary conductive pillar is not coplanar with a second top surface of the secondary conductive pillar;
   removing the first photoresist mask from the first semiconductor die to expose the primary conductive pillar and the secondary conductive pillar;
   electrically coupling the first semiconductor die to a substrate via the primary conductive pillar; and
   electrically coupling the first semiconductor die to a second semiconductor die via the secondary conductive pillar,
   wherein, prior to electrically coupling the first semiconductor to the substrate, the method further comprises:
   applying a second photoresist mask to the surface of the first semiconductor die covering the secondary conductive pillar, the second photoresist mask having a third resist opening aligned with the primary pillar and configured to further form the primary conductive pillar;
   electrochemically plating metal by an electrochemical plating process onto the first semiconductor die through the third resist opening to further form the primary conductive pillar to a third height greater than the second height; and
   removing the second photoresist mask from the semiconductor die to expose the primary conductive pillar extending to the third height and the secondary conductive pillar extending to the second height.

6. The method of claim 5, wherein a diameter of the second resist opening is smaller than a diameter of the first resist opening such that the second height is less than the first height.

7. The method of claim 5, wherein:
the first photoresist mask further comprises a fourth resist opening configured to form a tertiary conductive pillar; and prior to applying a second photoresist mask to the surface of the first semiconductor die,
the method further comprises electrochemically plating metal by an electrochemical plating process onto the first semiconductor die through the fourth resist opening to form the tertiary conductive pillar to a fourth height less than the second and third heights.

8. The method of claim 7, further comprising electrically coupling the first semiconductor die to a third semiconductor die via the tertiary pillars.

9. The method of claim 7, wherein the fourth resist opening has a smaller diameter than the second resist opening.

* * * * *